(12) United States Patent
Sakamoto

(10) Patent No.: US 10,553,822 B2
(45) Date of Patent: Feb. 4, 2020

(54) DISPLAY DEVICE, DISPLAY DEVICE PRODUCTION METHOD, AND DISPLAY DEVICE PRODUCTION DEVICE

(71) Applicant: Sharp Kabushiki Kaisha, Sakai, Osaka (JP)

(72) Inventor: Mayuko Sakamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 16/069,525

(22) PCT Filed: Mar. 31, 2017

(86) PCT No.: PCT/JP2017/013596
§ 371 (c)(1),
(2) Date: Jul. 12, 2018

(87) PCT Pub. No.: WO2018/179332
PCT Pub. Date: Oct. 4, 2018

(65) Prior Publication Data
US 2019/0363291 A1    Nov. 28, 2019

(51) Int. Cl.
*H01L 51/52* (2006.01)
*H01L 51/56* (2006.01)
*H01L 51/50* (2006.01)
*H01L 27/32* (2006.01)

(52) U.S. Cl.
CPC ...... *H01L 51/5253* (2013.01); *H01L 27/3276* (2013.01); *H01L 51/502* (2013.01); *H01L 51/56* (2013.01)

(58) Field of Classification Search
CPC ............... H01L 51/5253; H01L 51/502; H01L 27/3276; H01L 51/56
See application file for complete search history.

(56) References Cited

U.S. PATENT DOCUMENTS

| | | | |
|---|---|---|---|
| 9,704,933 B2* | 7/2017 | Sato | ............... H01L 51/5253 |
| 2003/0064569 A1 | 4/2003 | Takayama et al. | |
| 2008/0042180 A1* | 2/2008 | Yamazaki | ............... B82Y 10/00 257/306 |
| 2011/0134018 A1 | 6/2011 | Seo et al. | |
| 2011/0294244 A1 | 12/2011 | Hattori et al. | |

(Continued)

FOREIGN PATENT DOCUMENTS

| | | |
|---|---|---|
| JP | 2002-33464 A | 1/2002 |
| JP | 2003-163337 A | 6/2003 |
| JP | 2004-349543 A | 12/2004 |

(Continued)

OTHER PUBLICATIONS

Official Communication issued in International Patent Application No. PCT/JP2017/013596, dated Jun. 27, 2017.

*Primary Examiner* — Selim U Ahmed
(74) *Attorney, Agent, or Firm* — Keating & Bennett, LLP

(57) ABSTRACT

A display device, which includes a lower face film, a TFT layer, and a light emitting element layer, includes a resin layer provided above the lower face film and below the TFT layer. A first region and a second region are included in a lower face of the resin layer, and the second region is a carbide pattern in which an amount of carbide per unit area is greater than an amount of carbide per unit area in the first region.

20 Claims, 16 Drawing Sheets

(56) References Cited

U.S. PATENT DOCUMENTS

2017/0250372 A1* 8/2017 Tojo .................... H01L 51/5253

FOREIGN PATENT DOCUMENTS

| | | |
|---|---|---|
| JP | 2011-248072 A | 12/2011 |
| JP | 2017-24368 A | 2/2017 |
| JP | 2017-41391 A | 2/2017 |
| WO | 2012/049824 A1 | 4/2012 |
| WO | 2013/035298 A1 | 3/2013 |
| WO | 2014/073191 A1 | 5/2014 |

* cited by examiner

DISPLAY DEVICE, DISPLAY DEVICE PRODUCTION METHOD, AND DISPLAY DEVICE PRODUCTION DEVICE

TECHNICAL FIELD

The disclosure is related to a display device.

BACKGROUND ART

When producing a display device that includes EL elements, for example, a layered body including a resin layer, a TFT layer, a light emitting element layer and the like, is formed on a glass substrate, a lower face of the resin layer is irradiated with laser light from a reverse face of the glass substrate and the glass substrate is peeled off, and a film is bonded to the lower face of the resin layer.

CITATION LIST

Patent Literature

PTL 1: JP 2004-349543 A (published Dec. 9, 2004)

SUMMARY

Technical Problem

In a process of irradiating the lower face of the resin layer with the laser light and peeling the glass substrate, and bonding the film to the lower face of the resin layer, there is a concern that the layered body may become electrically charged and that may have a negative impact on the light emitting element layer.

Solution to Problem

A display device according to an embodiment of the disclosure is a display device including a lower face film, a TFT layer, and a light emitting element layer. A resin layer is provided above the lower face film and below the TFT layer. A first region and a second region are included in a lower face of the resin layer. The second region is a carbide pattern in which an amount of carbide per unit area is greater than an amount of carbide per unit area in the first region.

Advantageous Effects of Disclosure

According to the embodiment of the disclosure, the carbide pattern formed on the lower face of the resin layer can inhibit the display device from becoming electrically charged.

DESCRIPTION OF EMBODIMENTS

Figure 1:
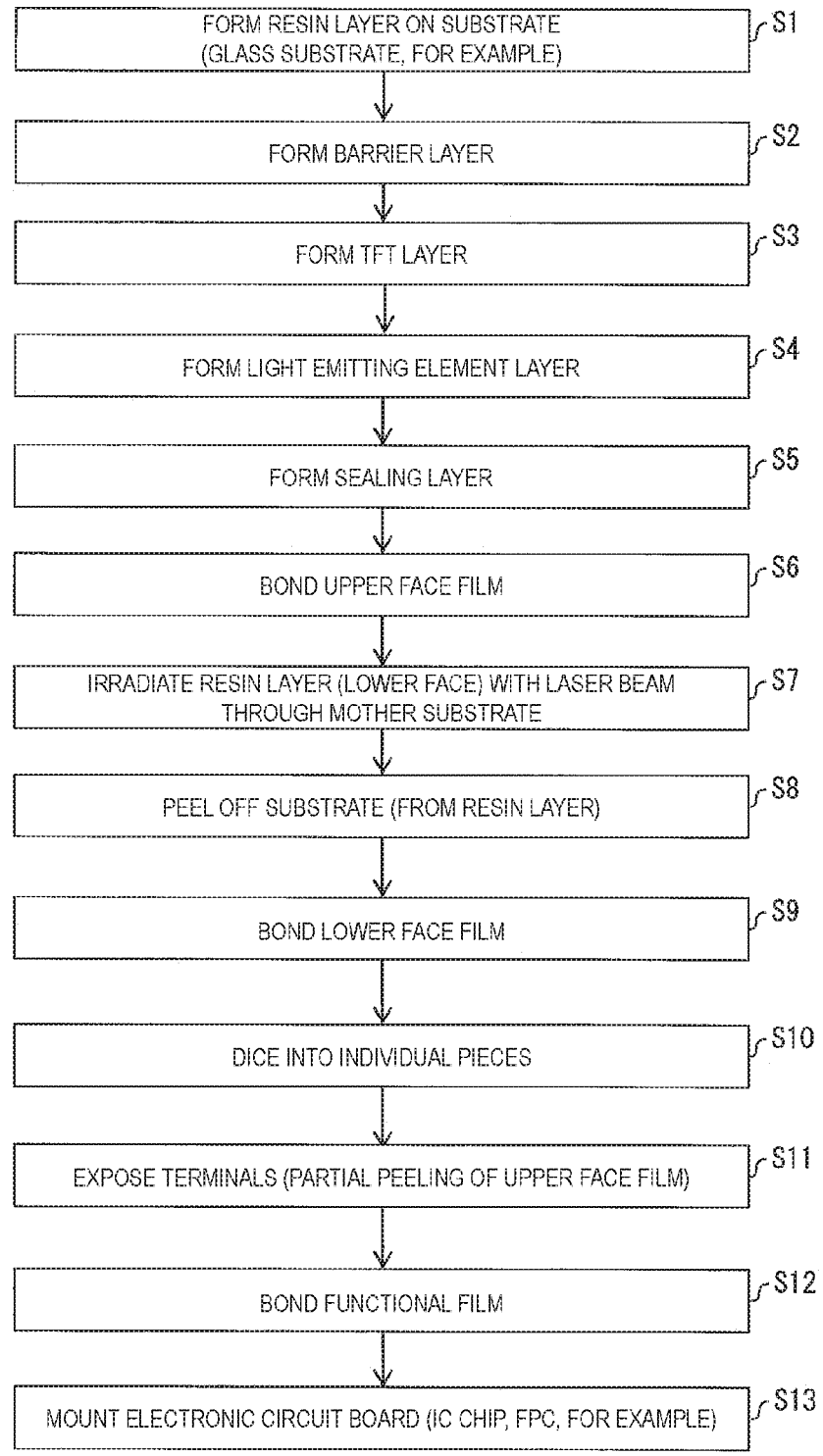
FIG. 1 is a flowchart illustrating an example of a display device production method.
Figure 2A:
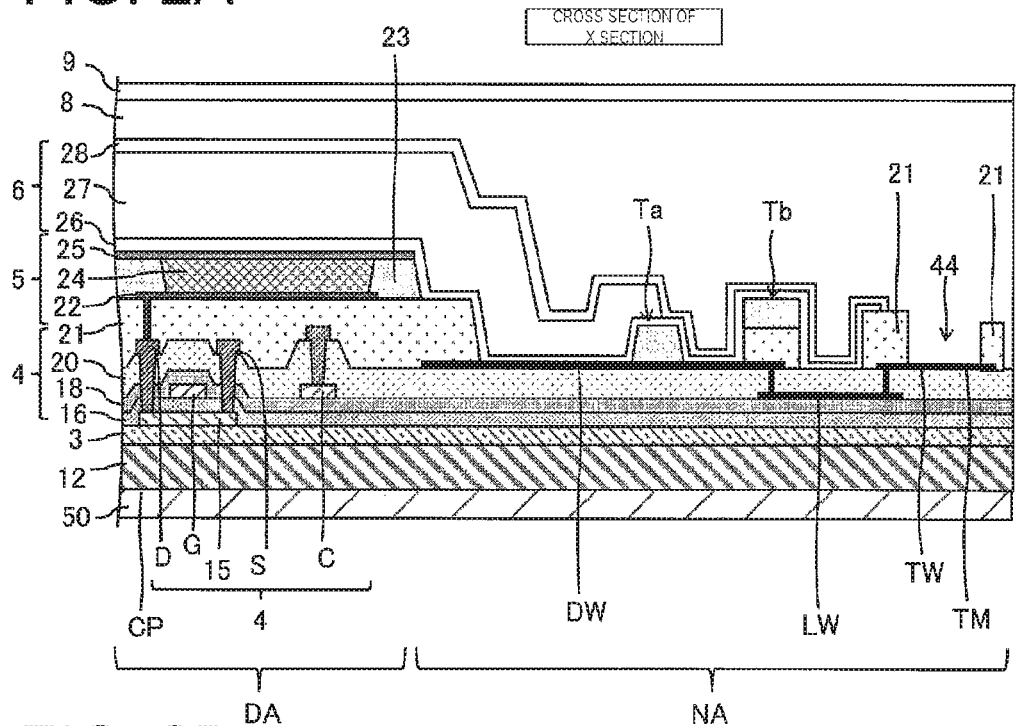
FIG. 2A is a cross-sectional view illustrating a configuration (a state in which a layered body is formed on a substrate) of the display device during formation.
Figure 2B:
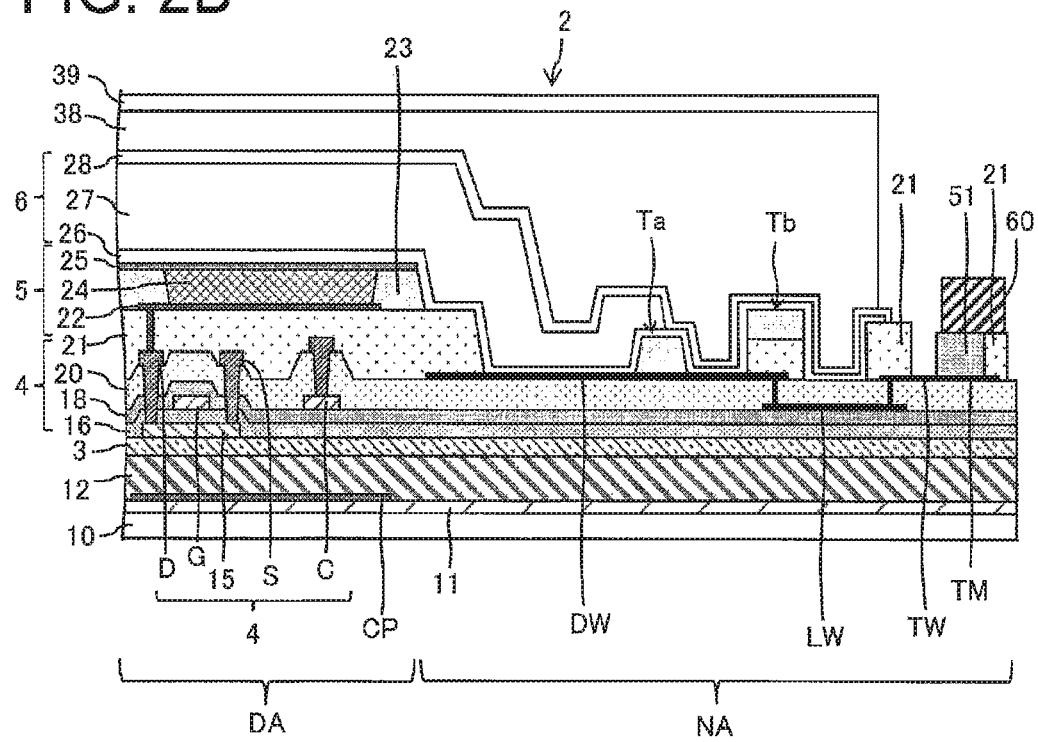
FIG. 2B is a cross-sectional view illustrating a configuration of the display device.
Figure 3:
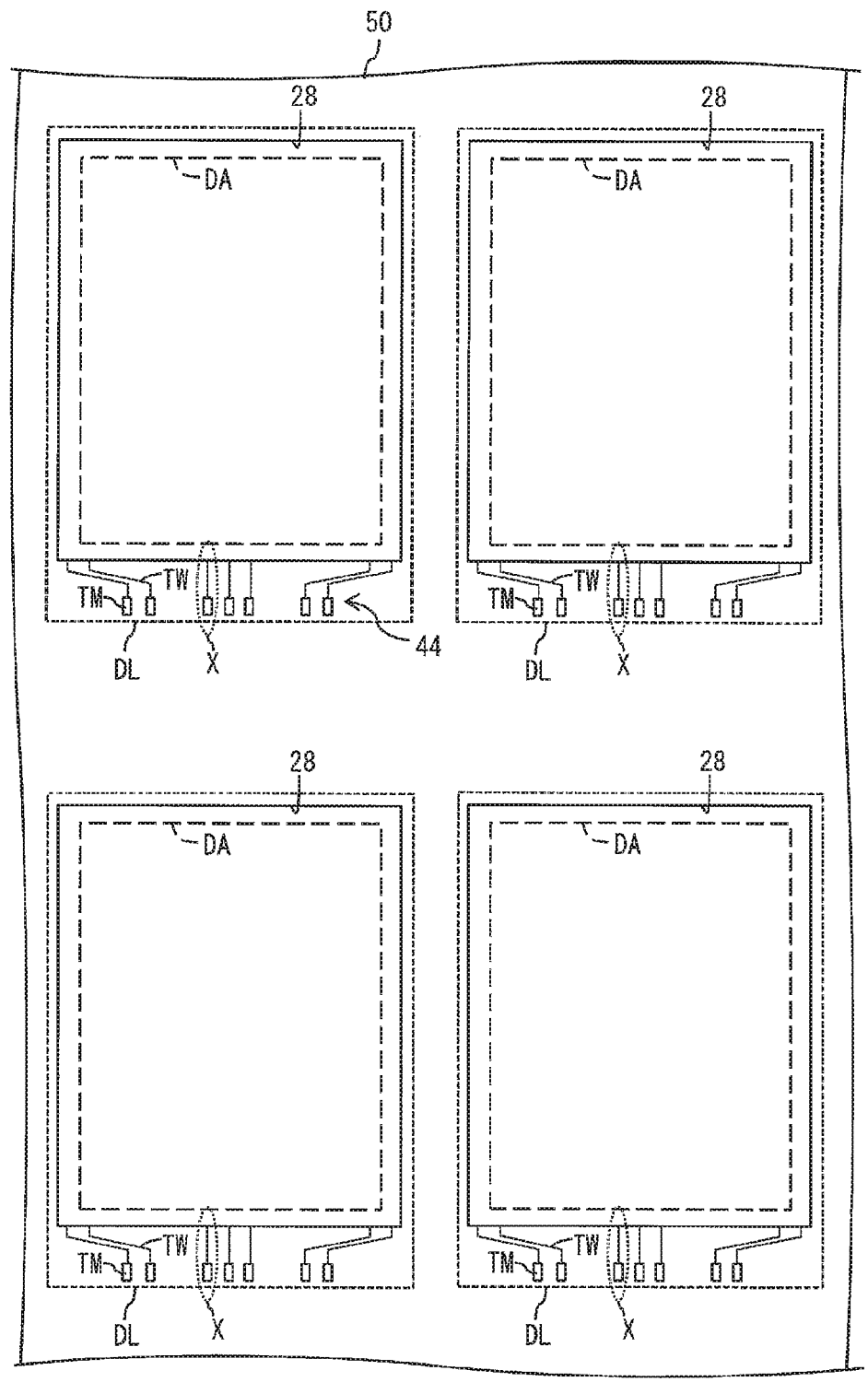
FIG. 3 is a plan view illustrating the configuration (the state in which the layered body is formed on the substrate) of the display device during formation.

FIG. 1 is a flowchart illustrating an example of a display device production method. FIG. 2A is a cross-sectional view illustrating a configuration (a state in which a layered body is formed on a substrate) of the display device during formation, and FIG. 2B is a cross-sectional view illustrating a configuration of the display device. FIG. 3 is a plan view illustrating the configuration (the state in which the layered body is formed on the substrate) of the display device during formation.

When the flexible display device is produced, as illustrated in FIG. 1, FIG. 2A and FIG. 3, first, a resin layer 12 is formed on a transparent substrate 50 (a mother glass, for example) (step S1). Next, a barrier layer 3 is formed (step S2). Next, a TFT layer 4 is formed (step S3). Next, a light emitting element layer (an OLED layer, for example) 5 is formed (step S4). Next, a sealing layer 6 is formed (step S5). Next, an upper face film 9 (a PET film, for example) is bonded to the sealing layer 6, with an adhesive layer 8 interposed therebetween (step S6).

Next, the lower face of the resin layer 12 is irradiated with a laser beam through the substrate 50 (step S7). Here, the resin layer 12 absorbs the laser beam with which the lower face of the substrate 50 has been irradiated and that has passed through the substrate 50, and as a result, the lower face of the resin layer 12 (an interface with the substrate 50) alters due to ablation, and a bonding strength between the resin layer 12 and the substrate 50 weakens. Next, the substrate 50 is peeled from the resin layer 12 (step S8). Next, as illustrated in FIG. 2B, a lower face film 10 (a PET film, for example) is bonded to the lower face of the resin layer 12, with an adhesive layer 11 interposed therebetween (step S9). Then, a layered body including the lower face film 10, the resin layer 12, the barrier layer 3, the TFT layer 4, the light emitting element layer 5, the sealing layer 6, and the upper face film 9 is divided along cutting lines DL, and a plurality of individual pieces are cut out (step S10). Next, terminal exposure is performed by peeling a part (a section on a terminal portion 44) of the upper face film 9 of the individual piece (step S11). Next, a functional film 39 is bonded to the upper side of the sealing layer 6 of the individual piece, with an adhesive layer 38 interposed therebetween (step S12). Then, an electronic circuit board 60 is mounted onto the terminal portion 44 of the individual piece, with an anisotropic conductive material 51 interposed therebetween (step S13). In this way, a display device 2 illustrated in FIG. 2B is obtained. Note that each of the above steps are performed by a display device production device.

Examples of the material used in the resin layer 12 include a polyimide, an epoxy, or a polyamide. Examples of the material used in the lower face film 10 include polyethylene terephthalate (PET).

The barrier layer 3 is a layer for preventing moisture or impurities from reaching the TFT layer 4 or the light emitting element layer 5 when the display device 2 is used. The barrier layer 3 can be configured, for example, by a silicon oxide film, a silicon nitride film, or a silicon oxinitride film, or by a layered film of these films, formed using CVD.

The TFT layer 4 includes a semiconductor film 15, an inorganic insulating film 16 (a gate insulating film) formed on the semiconductor layer 15, a gate electrode G formed on the gate insulating film 16, an inorganic insulating film 18 formed on the gate electrode G, a capacity electrode C formed on the inorganic insulating film 18, an inorganic insulating film 20 formed on the capacity electrode C, a source electrode S and a drain electrode D formed on the inorganic insulating film 20, and a flattening film 21 formed on the source electrode S and the drain electrode D.

A thin film transistor (TFT) is configured to include the semiconductor film 15, the inorganic insulating film 16 (the gate insulating film), and the gate electrode G. The source electrode S is connected to a source region of the semiconductor film 15, and the drain electrode D is connected to a drain region of the semiconductor film 15.

The semiconductor film 15 is formed of low-temperature polysilicon (LTPS) or an oxide semiconductor, for example. The gate insulating film 16 can be configured, for example, by a silicon oxide (SiOx) film, a silicon nitride (SiNx) film, or by a layered film of these films, formed using CVD. The gate electrode G, the source electrode S, the drain electrode D, and the terminals, for example, are configured by a single layer film including a metal such as aluminum (Al), tungsten (W), molybdenum (Mo), tantalum (Ta), chromium (Cr), titanium (Ti), or copper (Cu), or a layered film of these. Note that, in FIGS. 2A and 2B, the TFT is illustrated that has a top gate configuration in which the semiconductor film 15 forms the channel, but the TFT may have a bottom gate configuration (when the TFT channel is the oxide semiconductor, for example).

The inorganic insulating films 18 and 20 can be formed by CVD, for example, and can be configured by a silicon oxide (SiOx) film, a silicon nitride (SiNx) film, or by a layered film of these films. The flattening film (interlayer insulating film) 21 can be formed, for example, of a coatable photosensitive organic material such as a polyimide or an acrylic.

The terminal portion 44 is provided on an end portion (a non-active region NA that does not overlap with the light emitting element layer 5) of the TFT layer 4. The terminal portion 44 includes a terminal TM that is used for connecting with an IC chip or the electronic circuit board 60 such as an FPC and a terminal wire TW that is connected to the terminal TM. The terminal wire TW is electrically connected to various wires of the TFT layer 4 with a relay wire LW and a lead-out wire DW therebetween.

The terminal TM, the terminal wire TW, and the lead-out wire DW are formed in the same process as the source electrode S, for example, and thus, are formed in the same layer (on the inorganic insulating film 20) and of the same material (two layers of titanium film and an aluminum film sandwiched between the two layers of titanium film, for example) as the source electrode S. The relay wire LW is formed in the same process as the capacity electrode C, for example. End faces (edges) of the terminal TM, the terminal wire TW, and the lead-out wire DW are covered by the flattening film 21.

The light emitting element layer 5 (an organic light emitting diode layer, for example) includes an anode electrode 22 formed on the flattening film 21, a bank 23 that defines a sub pixel of an active region DA (a region that overlaps with the light emitting element layer 5), an electroluminescence (EL) layer 24 formed on the anode electrode 22, and a cathode electrode 25 formed on the EL layer 24, and a light emitting element (an organic light emitting diode (OLED), for example) is configured by the anode electrode 22, the EL layer 24, and the cathode electrode 25.

The EL layer 24 is formed in a region (a sub pixel region) surrounded by the bank (partition) 23, by vapor deposition or an ink-jet method. When the light emitting element layer 5 is the organic light emitting diode (OLED) layer, the EL layer 24 is formed, for example, by layering a hole injecting layer, a hole transport layer, a light emitting layer, an electron transport layer, and an electron injecting layer, in this order from a lower layer side.

The anode electrode (positive electrode) 22 is formed by layering Indium Tin Oxide (ITO) and an alloy containing Ag, for example, and has light reflectivity (to be described below in more detail). The cathode electrode 25 can be formed of a transparent electrically conductive material such as Indium Tin Oxide (ITO) and Indium Zincum Oxide (IZO).

When the light emitting element layer 5 is the OLED layer, holes and electrons are recombined inside the EL layer 24 by a drive current between the anode electrode 22 and the cathode electrode 25, and light is emitted as a result of excitons that are generated by the recombination falling into a ground state. Since the cathode electrode 25 is transparent, and the anode electrode 22 is light-reflective, the light emitted from the EL layer 24 travels upwards and results in top emission.

The light emitting element layer 5 is not limited to being configured by the OLED element, and may be configured by an inorganic light emitting diode or a quantum dot light emitting diode.

A bulging body Ta and a bulging body Tb that define edges of the organic sealing film 27 are formed in the non-active region NA. The bulging body Ta functions as a liquid stopper when the organic sealing film 27 is applied using an ink-jet method, and the bulging body Tb functions as a backup liquid stopper. Note that a lower portion of the bulging body Tb is configured by the flattening film 21, and functions as a protection film for an end face of the lead-out wire DW. The bank 23, the bulging body Ta, and an upper portion of the bulging body Tb can be formed in the same process, for example, by using a coatable photosensitive organic material such as a polyimide, an epoxy, or an acrylic.

The sealing layer 6 is transparent, and includes the first inorganic sealing film 26 covering the cathode electrode 25, the organic sealing film 27 formed on the first inorganic sealing film 26, and the second inorganic sealing film 28 covering the organic sealing film 27.

The first inorganic sealing film 26 and the second inorganic sealing film 28 can each be configured, for example, by a silicon oxide film, a silicon nitride film, or a silicon oxynitride film, or by a layered film of these, formed using CVD. The organic sealing film 27 is thicker than the first inorganic sealing film 26 and the second inorganic sealing film 28, is a transparent organic film, and can be formed of a coatable photosensitive organic material such as a polyimide, or an acrylic. For example, after applying an ink containing such an organic material onto the first inorganic sealing film 26 using the ink-jet method, the ink is cured by UV irradiation. The sealing layer 6 covers the light emitting element layer 5 and inhibits foreign matter, such as water and oxygen, from penetrating the light emitting element layer 5.

Note that the upper face film 9 is bonded onto the sealing layer 6 with the adhesive layer 8 interposed therebetween, and also functions as a support when the substrate 50 is peeled off. Examples of a material of the upper face film 9 include polyethylene terephthalate (PET).

The lower face film 10 is formed of PET or the like, and, by being bonded to the lower face of the resin layer 12 after the substrate 50 has been peeled off, functions as a support material and a protection material.

The functional film 39 has an optical compensation function, a touch sensor function, a protective function or the like, for example. The electronic circuit board 60 is the IC chip or the flexible printed circuit board (FPC) that is mounted on the plurality of terminals TM, for example.

Above, the explanation is given for a case of producing the flexible display device, but when a non-flexible display device is to be produced, since the peeling of the substrate and the like is not required, the process may advance from step S6 to step S10 illustrated in FIG. 1, for example.

In the present embodiment, as illustrated in FIG. 2B, in step S7 illustrated in FIG. 1, a carbide pattern CP is formed on the lower face of the resin layer 12. The carbide pattern CP functions as a destaticizing layer, or as a layer for adjusting a degree of close contact with the substrate 50, or as an adhesiveness adjustment layer with the lower face film 10.

First Embodiment

Figure 4:
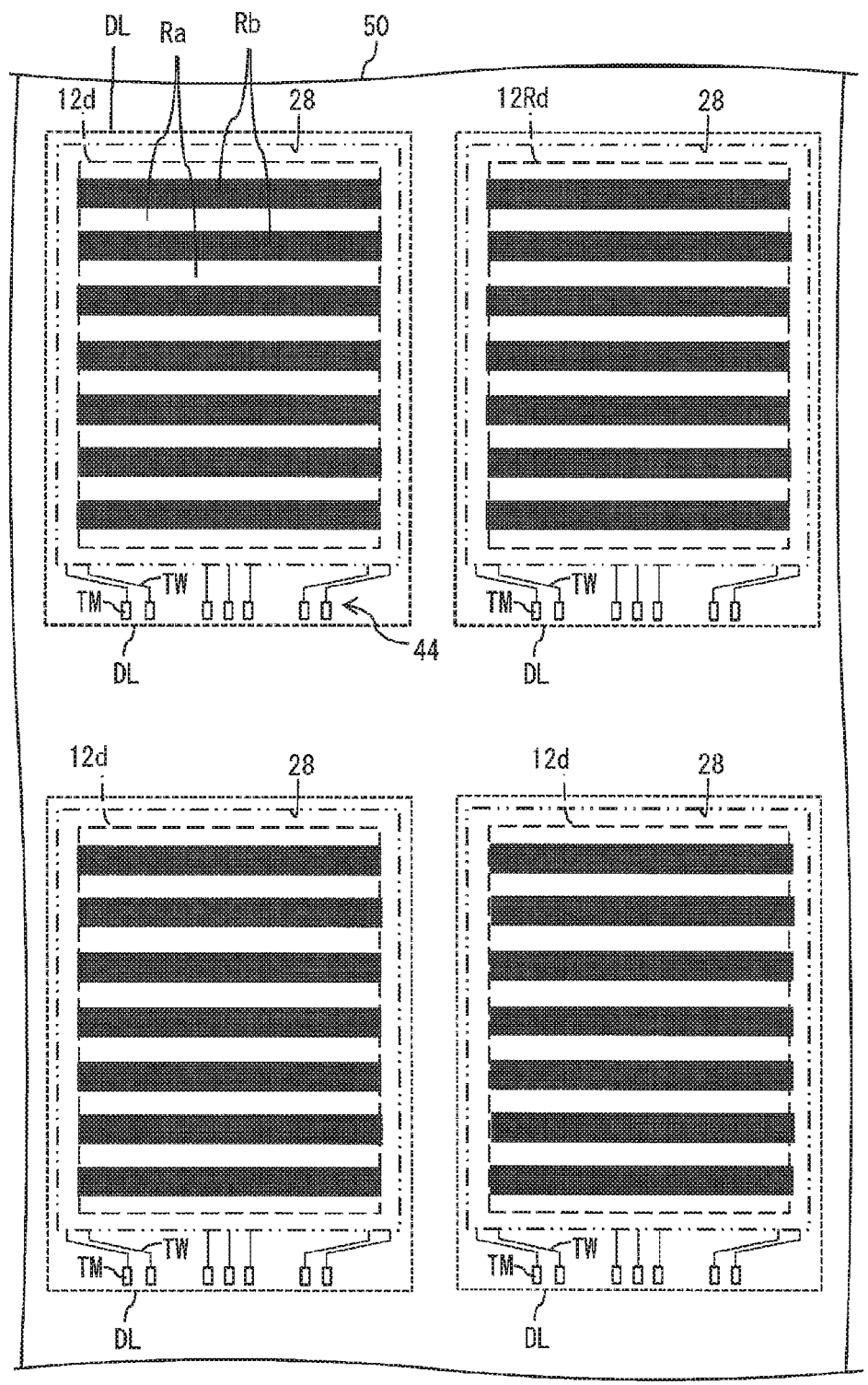
FIG. 4 is a plan view (a perspective plan view as seen from a reverse face of the substrate) illustrating a configuration (a state in which a carbide pattern is formed on a resin layer) of the display device according to a first embodiment during formation.
Figure 5A:
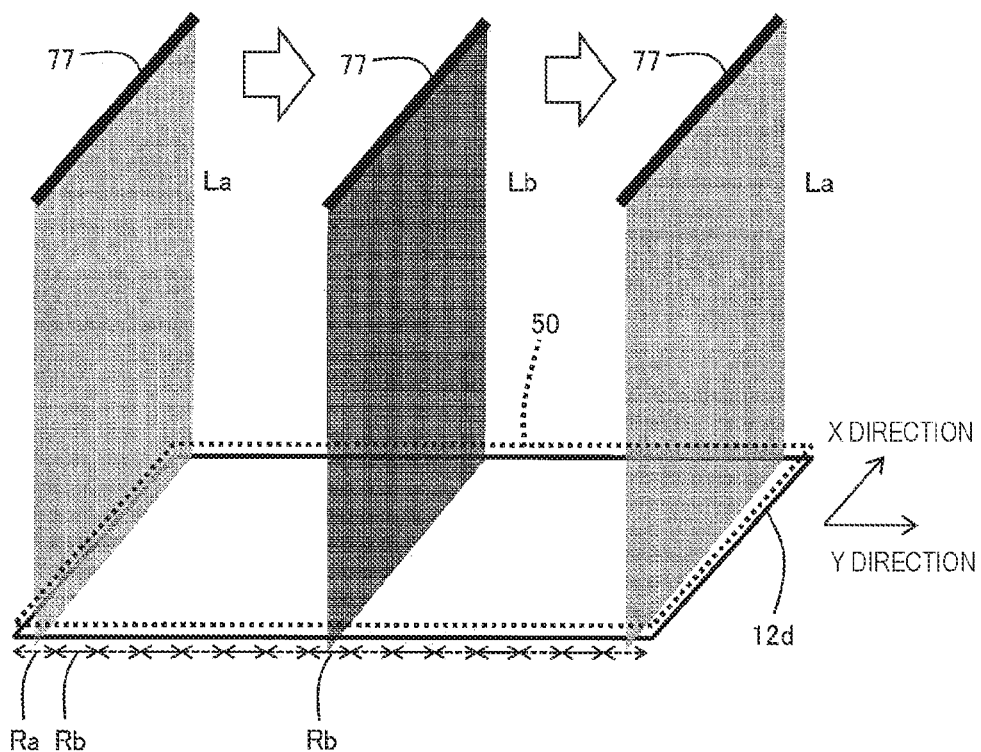
FIG. 5A is a schematic diagram illustrating a method for irradiating the resin layer with laser according to the first embodiment.

FIG. 4 is a plan view (a perspective plan view as seen from a reverse face of the substrate 50) illustrating a configuration (a state in which the carbide pattern CP is formed on the resin layer 12) of the display device 2 according to a first embodiment during formation. FIG. 5A is a schematic diagram illustrating a method for irradiating the resin layer 12 with laser according to the first embodiment, and FIG. 5B is a plan view of the carbide pattern CP.

Figure 5B:
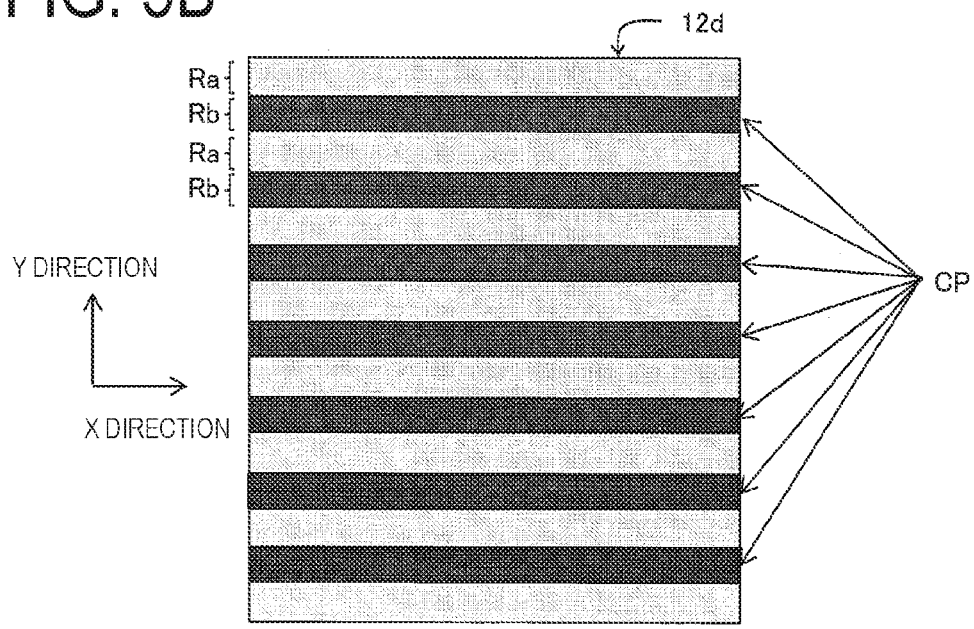
FIG. 5B is a plan view illustrating the carbide pattern.

In the first embodiment, as illustrated in FIG. 4 and FIGS. 5A and 5B, after the layered body that includes the resin layer 12, the TFT layer 4, and the light emitting element layer 5 is formed on the substrate 50 (the glass substrate, for example), first regions Ra and second regions Rb on the lower face of the resin layer 12 are irradiated with the laser from the reverse face of the substrate 50, using different irradiation conditions. More specifically, by increasing an irradiation intensity of the laser light to be stronger in the second regions Rb than in the first regions Ra, the second regions Rb have the carbide pattern CP with a greater amount (mass, or film thickness, for example) of carbide per unit area than the first regions Ra.

The second regions Rb are included in an overlapping portion 12d, which is a portion of the lower face of the resin layer 12 that overlaps with the light emitting element layer 5, and are formed in a lateral stripe array when an x direction in the drawings is taken as a lateral direction. Thus, as illustrated in FIG. 5B, the carbide pattern CP formed in the second regions Rb is also formed in a lateral stripe array when the x direction is the lateral direction.

A laser device 77 illustrated in FIG. 5A scans (in a y direction) the overlapping portion 12d from one end to another end of the first region Ra in the y direction, while emitting intermittent shots of a long thin beam that extends in the x direction (at a first irradiation intensity), and then scans (in the y direction) the overlapping portion 12d from one end to another end of the second region Rb in the y direction, while emitting intermittent shots of the long thin beam (at a second irradiation intensity that is stronger than the first irradiation intensity). Note that the laser device 77 may be moved in the above-described manner, or the layered body that includes the substrate 50 and the resin layer 12 may be moved without moving the laser device 77. Furthermore, for example, the first irradiation intensity can be set at a minimum value at which the first regions Ra and the substrate 50 can be separated. The second irradiation intensity may be set while taking into account the function as the destaticizing layer or the adhesiveness adjustment layer, for example.

In this way, by forming the lateral stripe array carbide pattern CP in the overlapping region 12d that is the portion of the lower face of the resin layer 12 that overlaps with the light emitting element layer 5, the layered body in steps S8 to S9 in FIG. 1 can be prevented from becoming electrically charged. The carbide pattern CP may be formed in vertical stripes that extend in the y direction. A fixed laser or an excimer laser can be used as a light source of the laser device 77, for example.

Figure 6A:
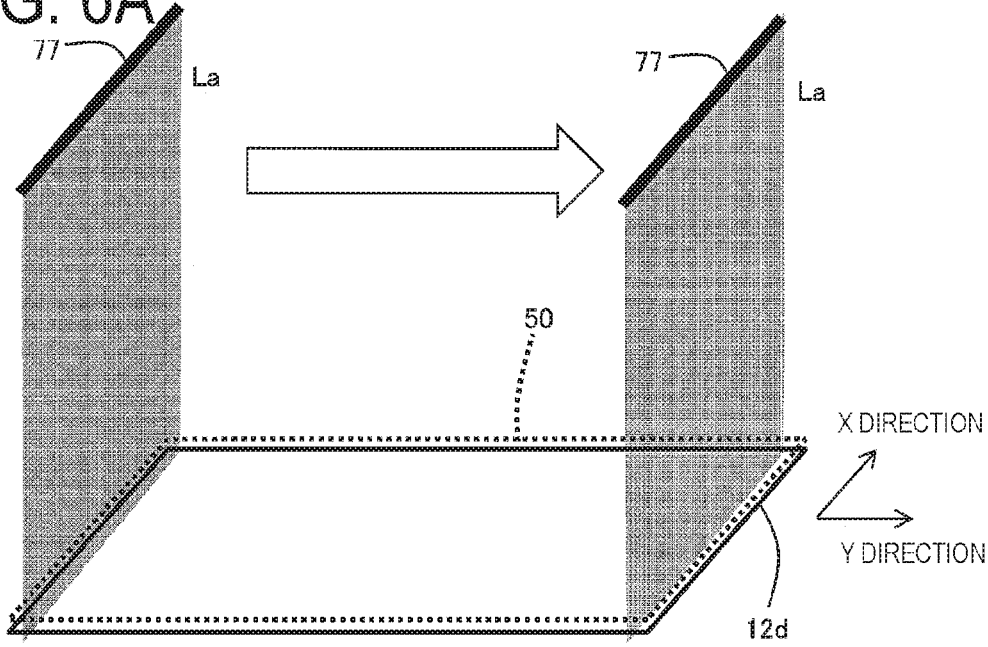
FIGS. 6A and 6B are schematic diagrams illustrating another example of a method for performing the laser irradiation according to the first embodiment.
Figure 6B:
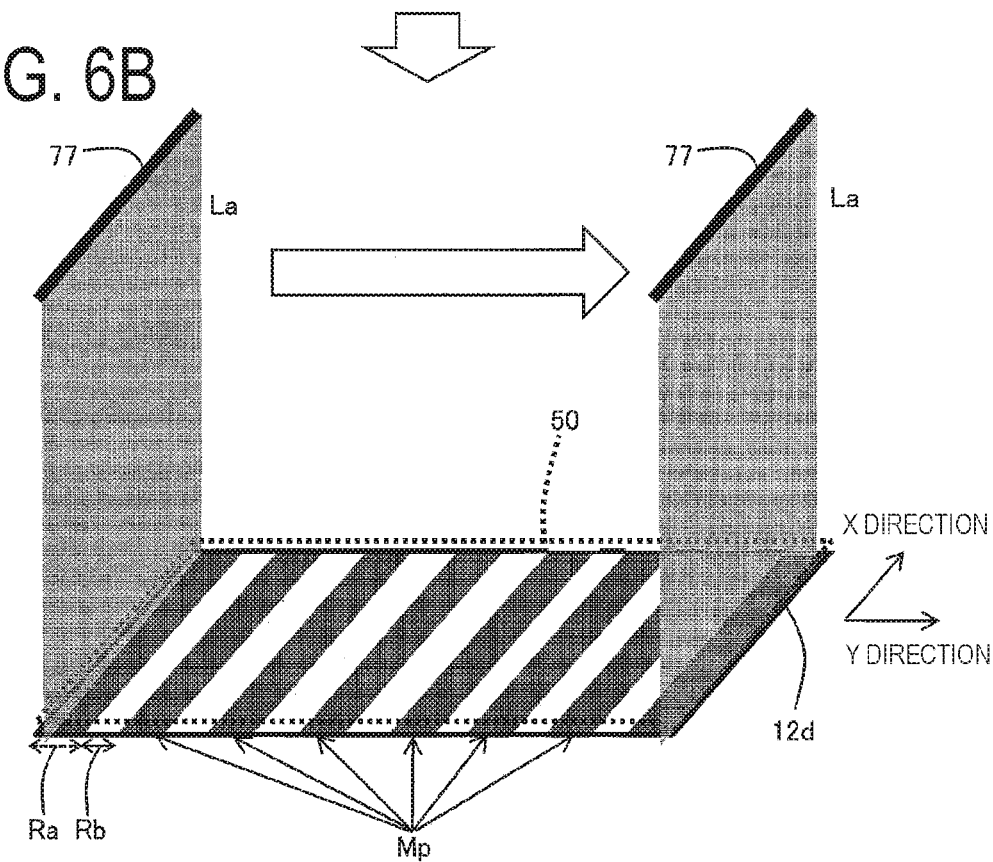

FIGS. 6A and 6B are schematic diagrams illustrating another example of a method for performing the laser irradiation according to the first embodiment. The laser device 77 illustrated in FIG. 6A scans the overlapping portion 12d from one end to another end (in the y direction), the overlapping portion 12d being the portion of the lower face of the resin layer 12 that overlaps with the light emitting element layer 5, while emitting intermittent shots of the long thin beam that extends in the x direction (at the first irradiation intensity). After that, in a state in which the first regions Ra are covered by a mask Mp, the laser device 77 scans the overlapping portion 12d from the one end to the other end (in the y direction), the overlapping portion 12d being the portion of the lower face of the resin layer 12 that overlaps with the light emitting element layer 5, while emitting the intermittent shots of the long thin beam that extends in the x direction (at the first irradiation intensity). In this way, by causing the number of irradiations of the second regions Rb to be greater than the number of irradiations of the first regions Ra, the carbide pattern CP illustrated in FIG. 5B can be formed.

Figure 7A:
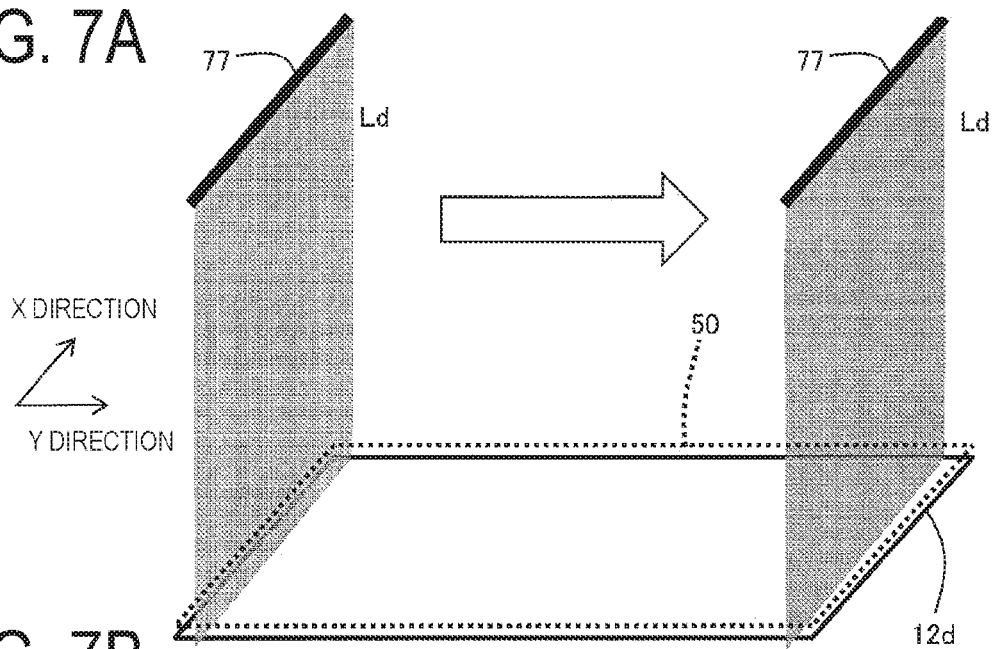
FIGS. 7A and 7B are schematic diagrams illustrating yet another example of a method for performing the laser irradiation according to the first embodiment.
Figure 7B:
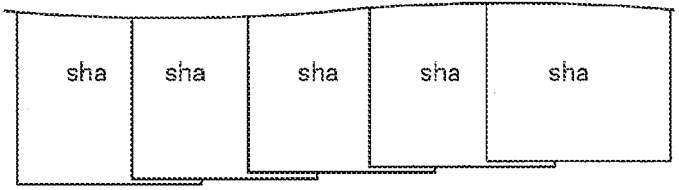
Figure 7C:
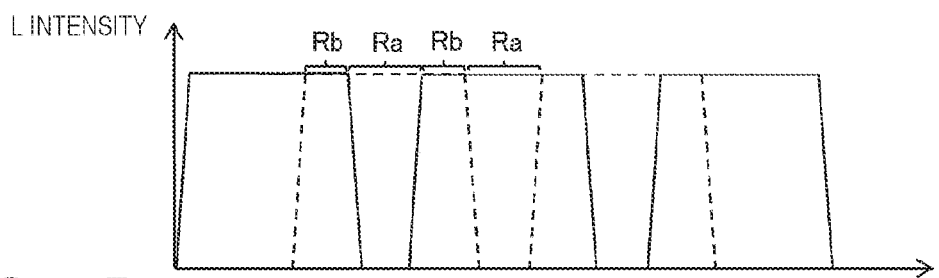
FIG. 7C illustrates an intensity distribution of shots illustrated in FIG. 7B.
Figure 7D:
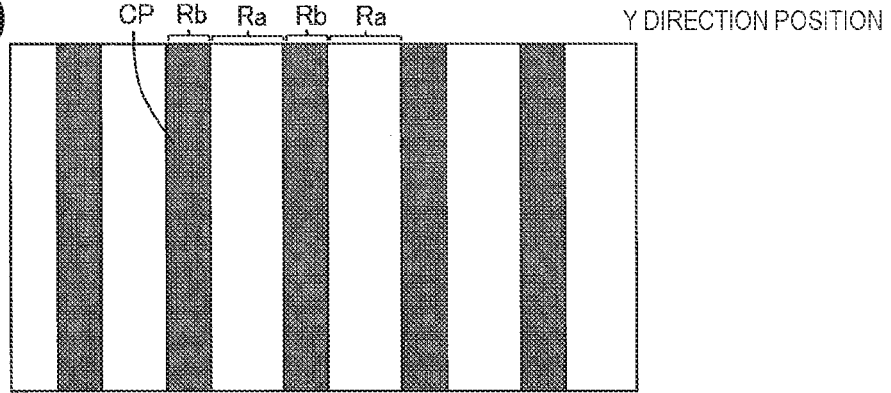
FIG. 7D is a schematic diagram illustrating a carbide pattern CP formed by the laser irradiation illustrated in FIGS. 7A and 7B.

FIGS. 7A and 7B are schematic diagrams illustrating yet another example of a method for performing the laser irradiation according to the first embodiment, FIG. 7C illustrates an intensity distribution of shots illustrated in FIG. 7B, and FIG. 7D is a schematic diagram illustrating the carbide pattern CP formed by the laser irradiation illustrated in FIGS. 7A and 7B. The laser device 77 illustrated in FIG. 7A scans the overlapping portion 12d from the one end to the other end (in the y direction), the overlapping portion 12d being the portion of the lower face of the resin layer 12 that overlaps with the light emitting element layer 5, while emitting intermittent shots of the long thin beam that extends in the x direction (where the irradiation intensity of each of the shots is the same). It is sufficient for the scan to be performed once. Here, as illustrated in FIG. 7B, an overlap ratio of each of shot regions sha is set to be less than 50%. In this way, by setting the overlap ratio so as to cause the number of irradiations of the second regions Rb (twice) to be greater than the number of irradiations of the first regions Ra (once), the second regions Rb can be the carbide pattern CP illustrated in FIG. 7D. Note that the top hat type of intensity distribution, as illustrated in FIG. 7C, can be obtained by an excimer laser, for example. A width in the y direction of each of the shot regions sha is from 20 to 40 µm, for example.

Figure 8A:
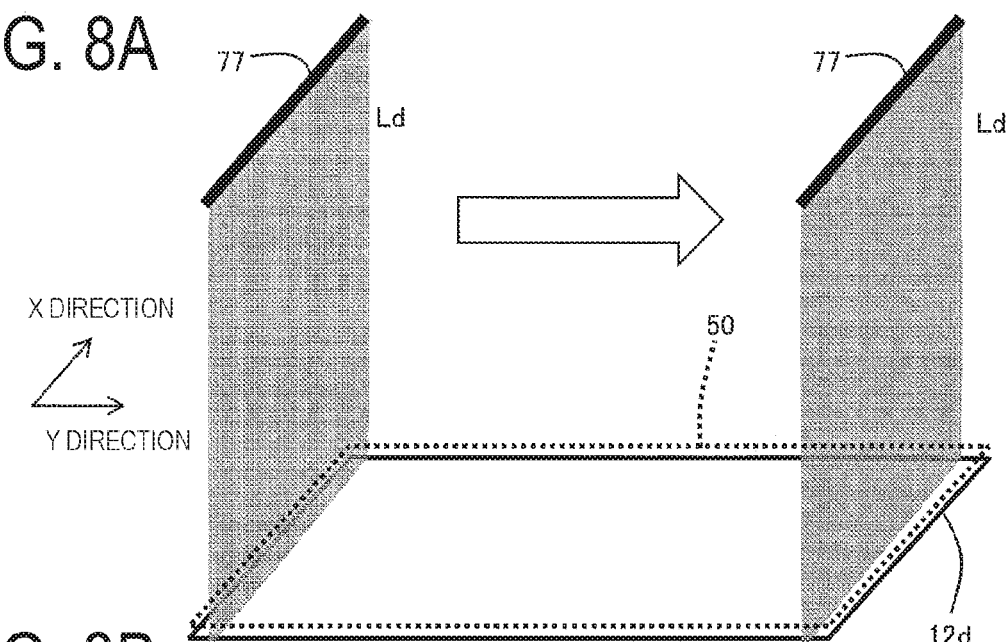
FIGS. 8A and 8B are schematic diagrams illustrating yet another example of a method for performing the laser irradiation according to the first embodiment.
Figure 8B:
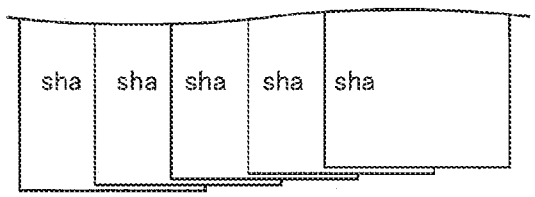
Figure 8C:
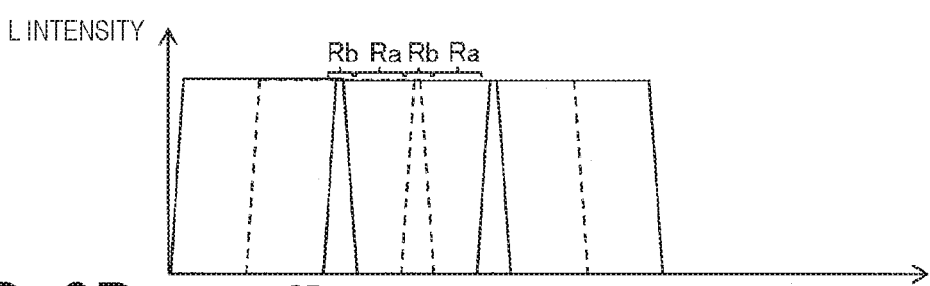
FIG. 8C illustrates an intensity distribution of shots illustrated in FIG. 8B.
Figure 8D:
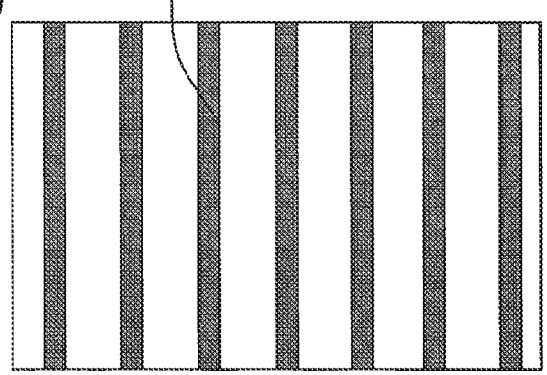
FIG. 8D is a schematic diagram illustrating the carbide pattern CP formed by the laser irradiation illustrated in FIGS. 8A and 8B.

To adjust the overlap ratio, a repetition frequency (the number of shots per unit time), or a scanning speed of the laser device 77 can be changed, for example. For example, by reducing the scanning speed without changing the repetition frequency, the overlap ratio can be increased. As illustrated in FIGS. 8A to 8C, by performing one scan while the overlap ratio of each of the shot regions sha is set to be equal to or greater than 50%, the carbide pattern CP illustrated in FIG. 8D can be obtained.

Figure 9:
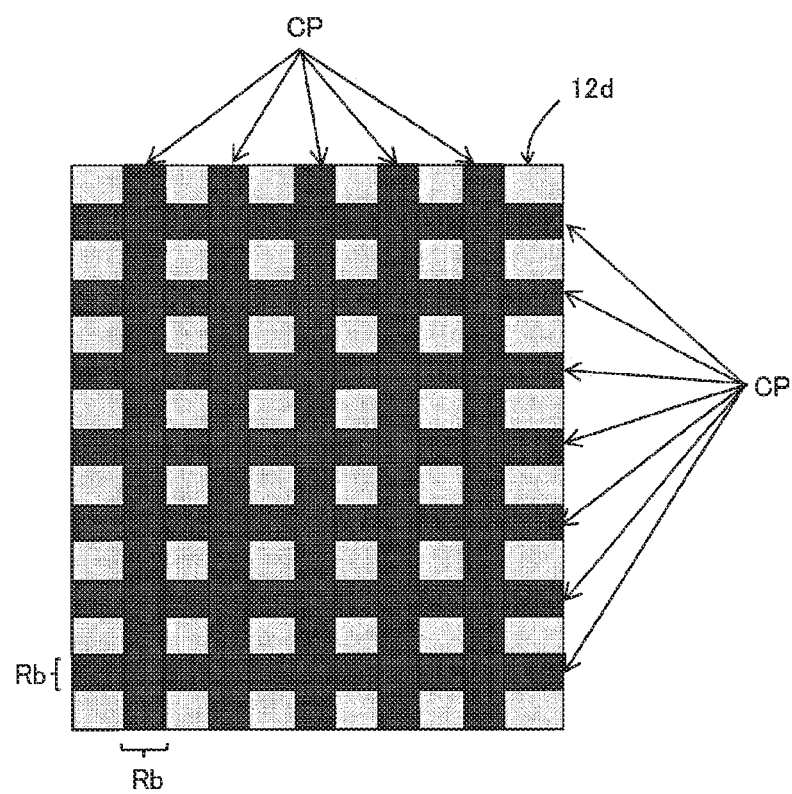
FIG. 9 is a schematic diagram illustrating another example of the carbide pattern according to the first embodiment.

For example, according to a configuration illustrated in FIGS. 5A to 8D, the laser device 77 scans the overlapping portion 12d from the one end to the other end (in the y direction), the overlapping portion being the portion of the lower face of the resin layer 12 that overlaps with the light emitting element layer 5, and next, the layered body including the resin layer 12 is rotated by 90 degrees. The laser device 77 scans the overlapping portion 12d from one end to another end (in the y direction), the overlapping portion 12d being the portion of the lower face of the resin layer 12 that overlaps with the light emitting element layer 5, and thus the second regions Rb can be the matrix-shaped carbide pattern CP illustrated in FIG. 9.

Figure 10:
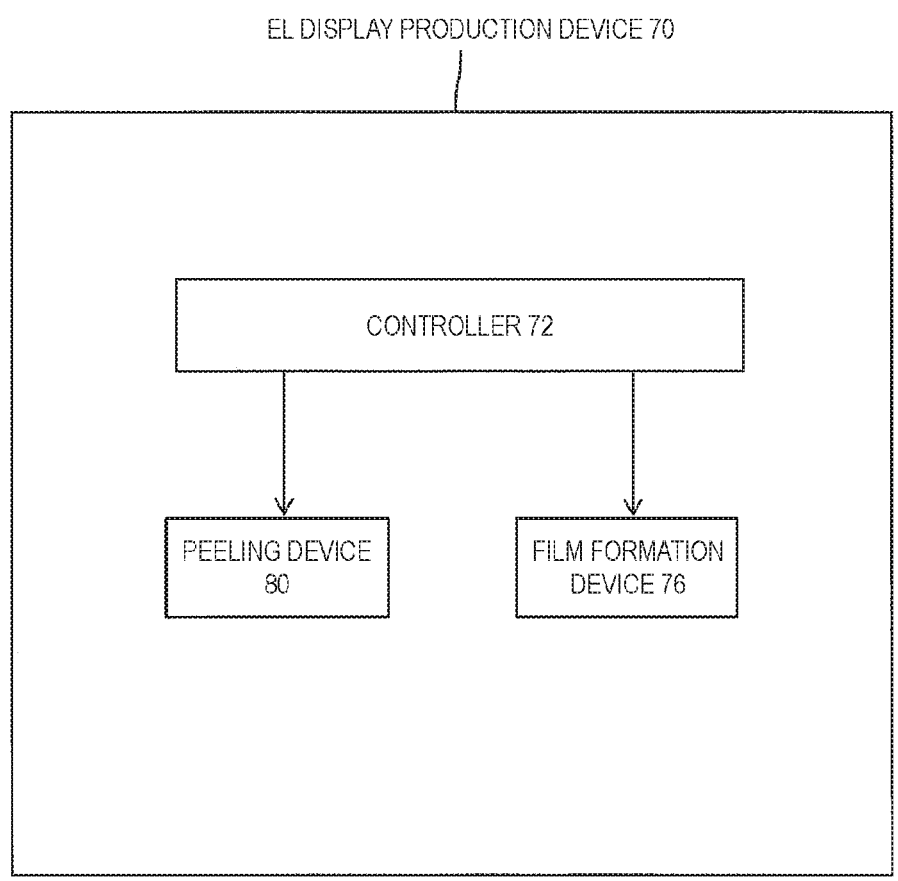
FIG. 10 is a block diagram illustrating a configuration of a display device production device of the present embodiment.

Note that, as illustrated in FIG. 10, a display device production device 70 includes a film formation device 76, a peeling device 80 including the laser device 77, and a controller 72 configured to control these devices. The peeling device 80 configured to receive the control of the controller 72 performs step S7 to step S8 illustrated in FIG. 1.

Second Embodiment

Figure 11:
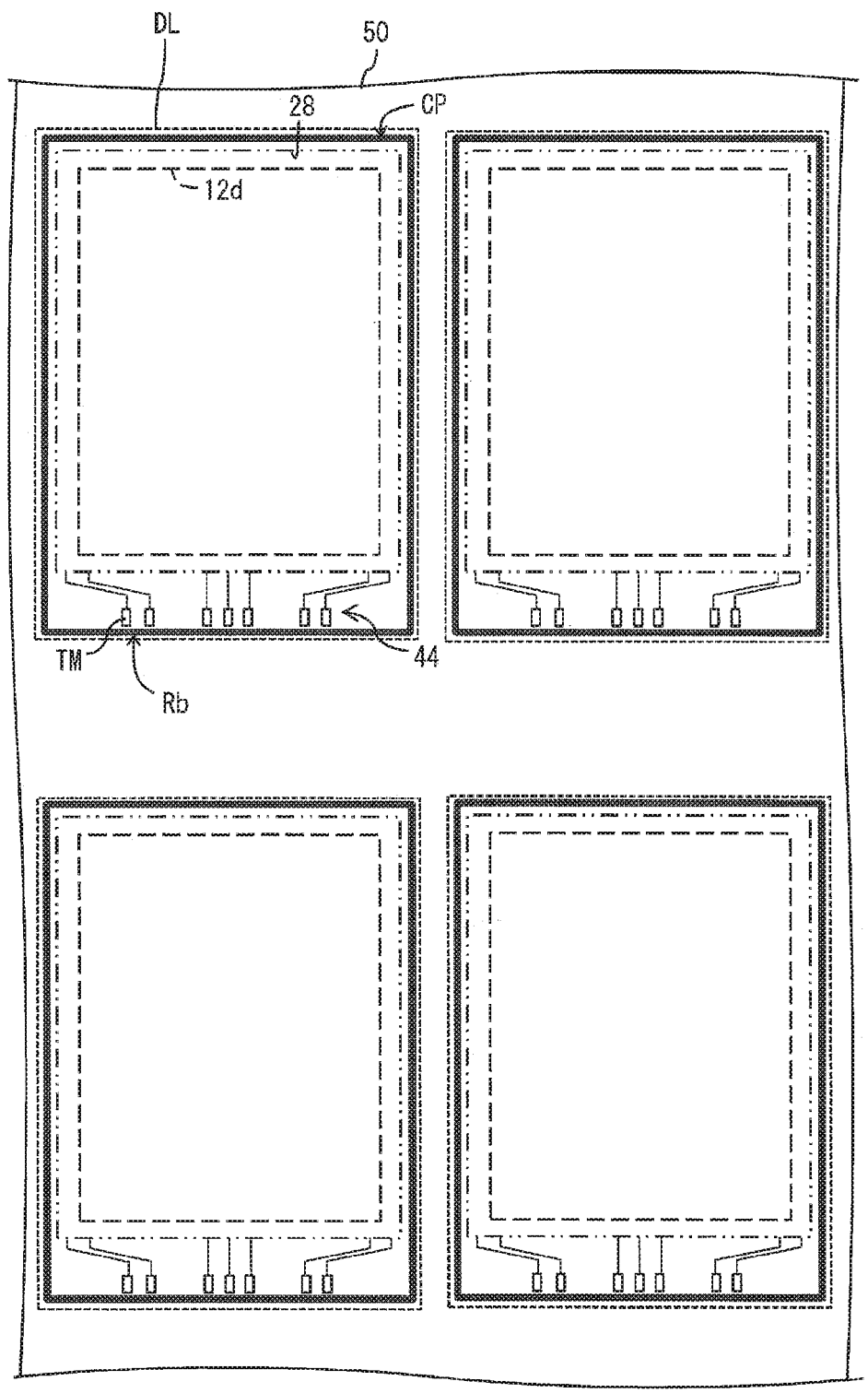
FIG. 11 is a plan view (a perspective plan view as seen from the reverse face of the substrate) illustrating a configuration (the state in which the carbide pattern is formed on the resin layer) of the display device according to a second embodiment during formation.

FIG. 11 is a plan view (a perspective plan view as seen from the reverse face of the substrate 50) illustrating a configuration (the state in which the carbide pattern CP is formed on the resin layer 12) of the display device 2 according to a second embodiment during formation. As illustrated in FIG. 11, the second region Rb may be the carbide pattern CP in which the second region Rb has a shape that surrounds the overlapping portion 12d that is the portion of the lower face of the resin layer 12 that overlaps with the light emitting element layer 5. This makes it possible to reduce, in addition to the destaticizing effect, a degree of close contact with the substrate 50, and when peeling the substrate 50, wrinkles and the like do not easily occur in the active region DA.

Third Embodiment

Figure 12:
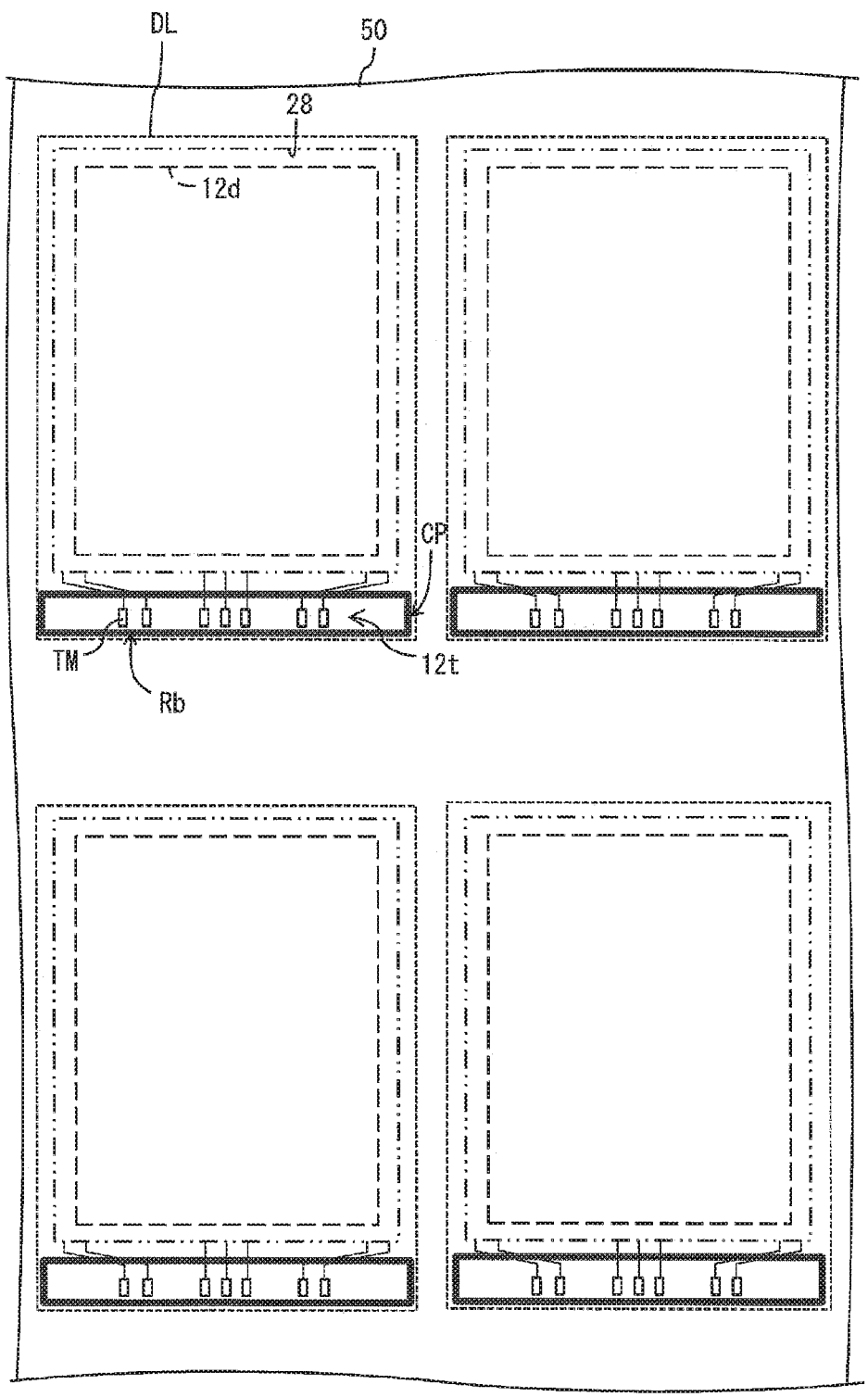
FIG. 12 is a plan view (a perspective plan view as seen from the reverse face of the substrate) illustrating a configuration (the state in which the carbide pattern is formed on the resin layer) of the display device according to a third embodiment during formation.

FIG. 12 is a plan view (a perspective plan view as seen from the reverse face of the substrate 50) illustrating a configuration (the state in which the carbide pattern CP is formed on the resin layer 12) of the display device 2 according to a third embodiment during formation. As illustrated in FIG. 12, the second region Rb may be the carbide pattern CP in which the second region Rb has a shape that surrounds an overlapping portion 12t, which is a portion of the lower face of the resin layer 12 that overlaps with the terminal portion 44. This makes it possible to reduce, in addition to the destaticizing effect, a degree of close contact with the substrate 50, and when peeling the substrate 50, wrinkles and the like do not easily occur in the terminal portion 44.

Fourth Embodiment

Figure 13A:
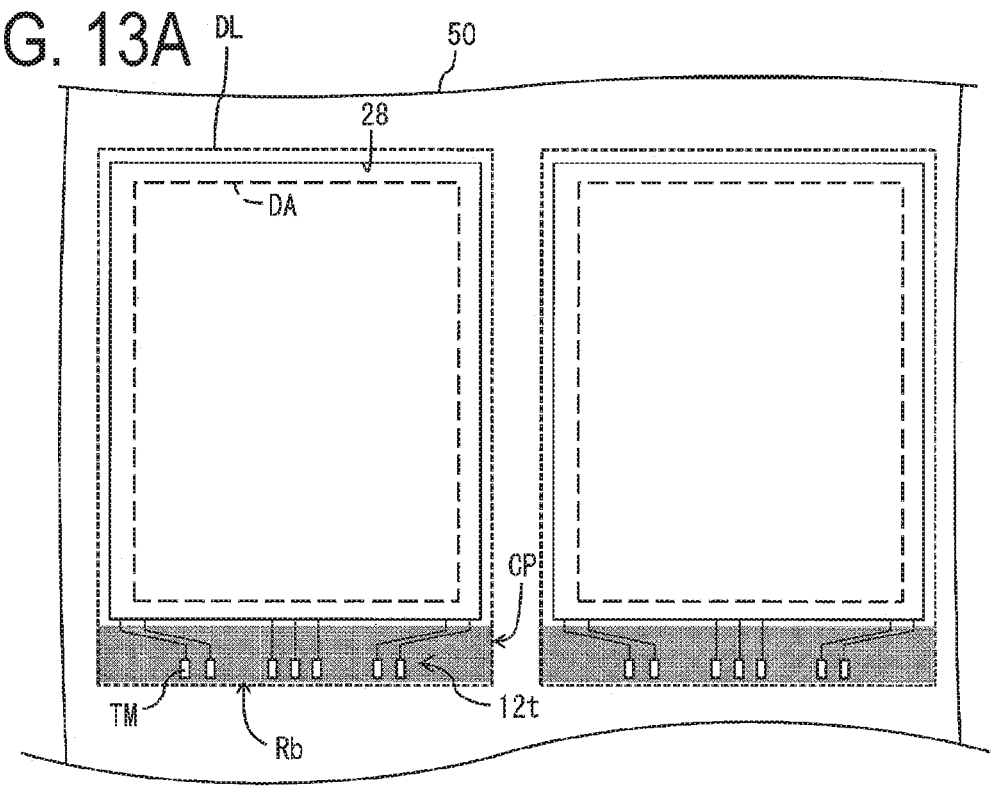
FIGS. 13A and 13B are plan views (perspective plan views as seen from the reverse face of the substrate) illustrating a configuration (the state in which the carbide pattern is formed on the resin layer) of the display device according to a fourth embodiment during formation.
Figure 13B:
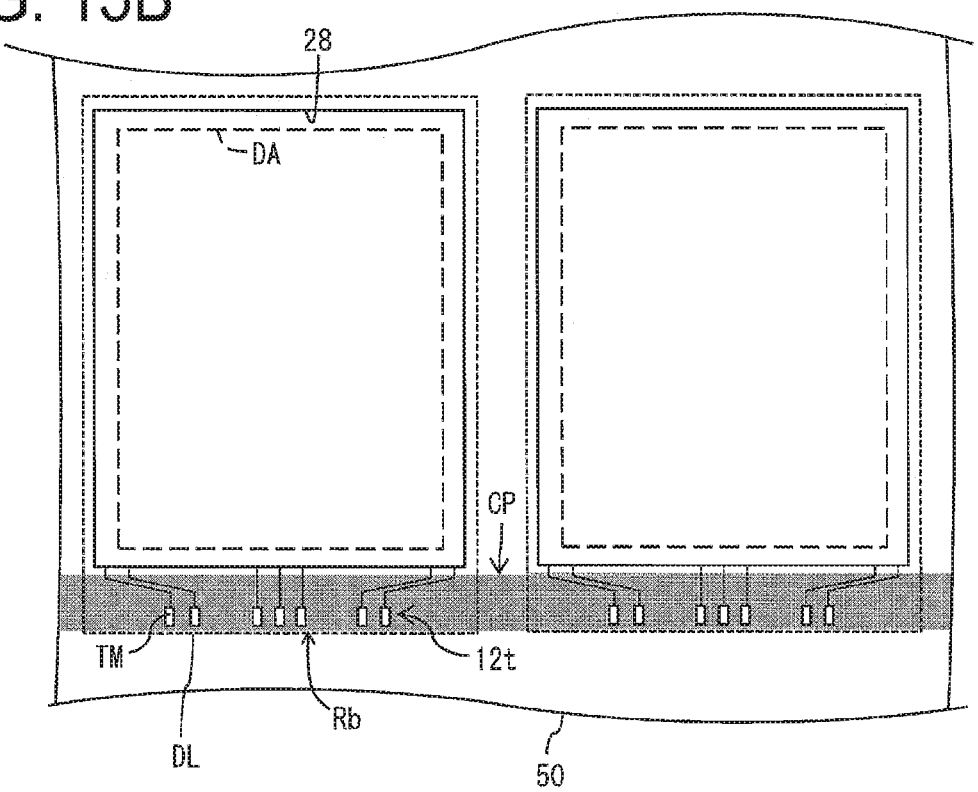

FIGS. 13A and 13B are plan views (perspective plan views as seen from the reverse face of the substrate 50) illustrating a configuration (the state in which the carbide pattern CP is formed on the resin layer 12) of the display device 2 according to a fourth embodiment during formation. As illustrated in FIGS. 13A and 13B, the second region Rb may be the carbide pattern CP in which the second region Rb is the overlapping portion 12t that is the portion of the lower face of the resin layer 12 that overlaps with the terminal portion 44. In this way, in addition to the destaticizing effect, an effect of reduced adhesiveness with the lower face film 10 is achieved, and, for example, when the terminal portion 44 is bent toward the reverse face side, a portion of the lower face film 10 that overlaps with the terminal portion 44 is more easily removed. Furthermore, even when the terminal portion 44 is bent while the lower face film 10 is still attached, since the adhesiveness between the lower face film 10 and the resin layer 12 is small, there is an advantage that bending stress becomes smaller.

Note that edges of the carbide pattern CP need not necessarily be aligned with the cutting lines DL, and the carbide pattern CP may be formed so as to traverse a plurality of individual regions aligned in the lateral direction (the direction in which the terminals are aligned), as illustrated in FIG. 13B.

Fifth Embodiment

Figure 14:
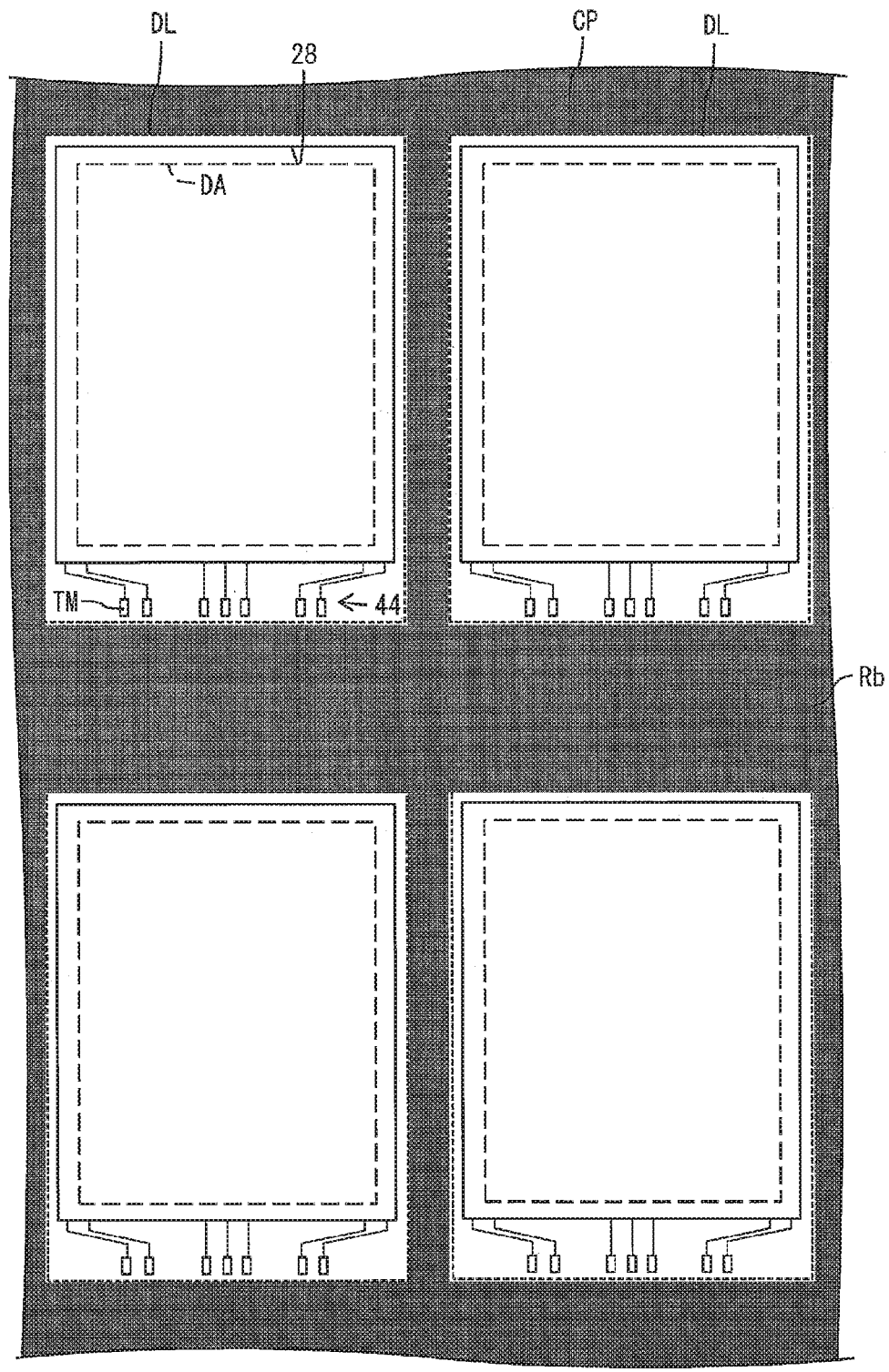
FIG. 14 is a plan view (a perspective plan view as seen from the reverse face of the substrate) illustrating a configuration (the state in which the carbide pattern is formed on the resin layer) of the display device according to a fifth embodiment during formation.

FIG. 14 is a plan view (a perspective plan view as seen from the reverse face of the substrate 50) illustrating a configuration (the state in which the carbide pattern CP is formed on the resin layer 12) of the display device 2 according to a fifth embodiment during formation. As illustrated in FIG. 14, the second region Rb may be the carbide pattern CP in which the second region Rb is a gap region between the cutting line DL corresponding to one of adjacent two of individual pieces and the cutting line DL of the other of the adjacent two of individual pieces. This makes it possible to reduce, in addition to the destaticizing effect, a degree of close contact with the substrate 50, and there is an advantage in that the substrate 50 is more easily peeled from the resin layer 12.

Sixth Embodiment

Figure 15A:
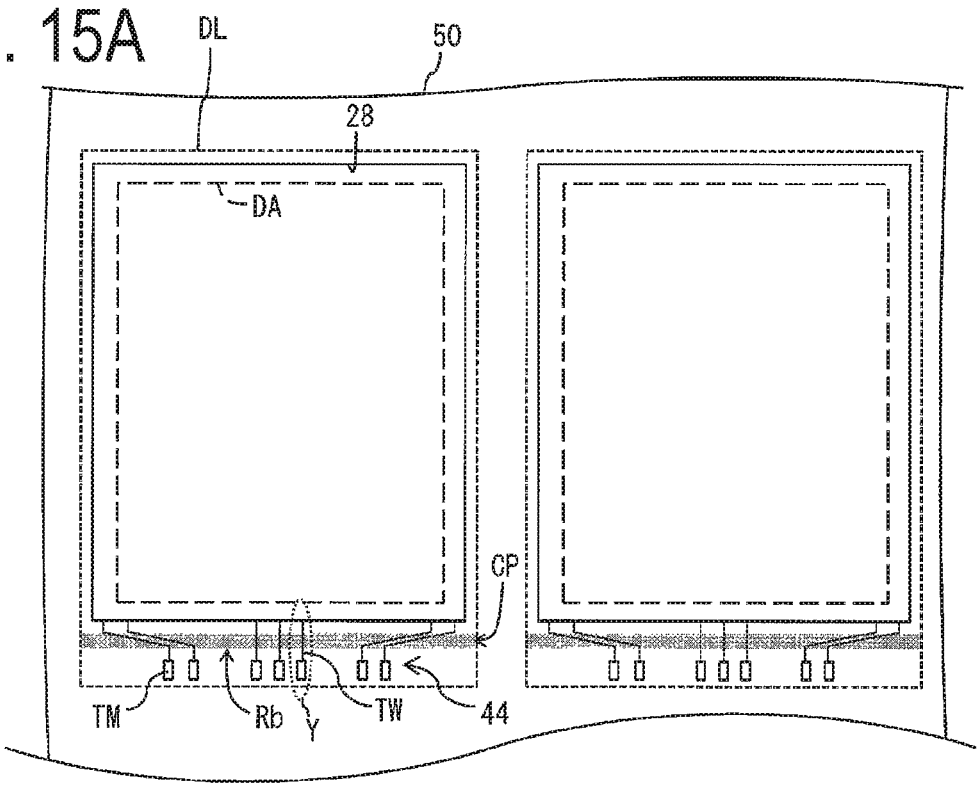
FIGS. 15A and 15B are plan views (perspective plan views as seen from the reverse face of the substrate) illustrating a configuration (the state in which the carbide pattern is formed on the resin layer) of the display device according to a sixth embodiment during formation.
Figure 15B:
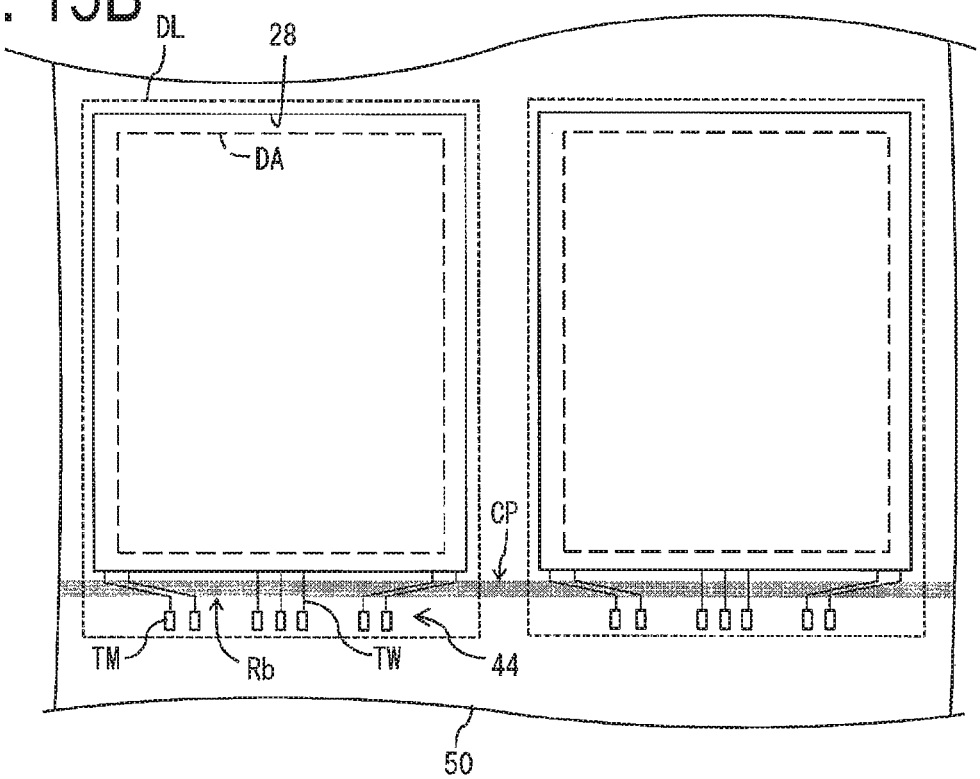
Figure 16:
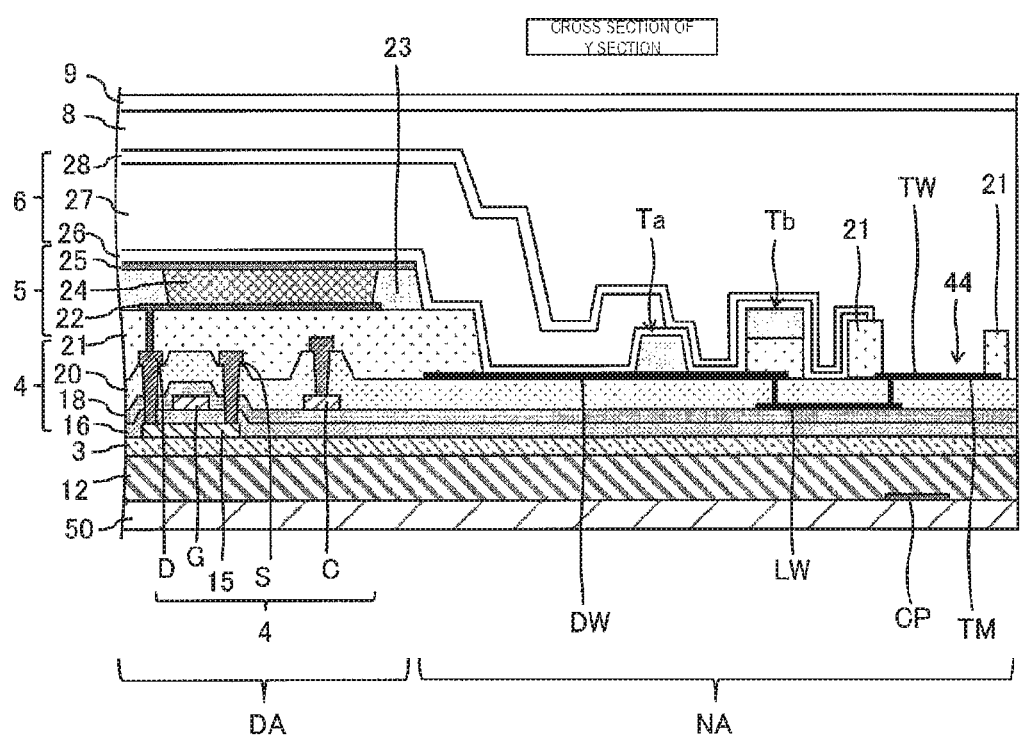
FIG. 16 is a cross-sectional view of a part of FIG. 15.

FIGS. 15A and 15B are plan views (perspective plan views as seen from the reverse face of the substrate 50) illustrating a configuration (the state in which the carbide pattern CP is formed on the resin layer 12) of the display device 2 according to a sixth embodiment during formation. FIG. 16 is a cross-sectional view of a part of FIGS. 15A and 15B.

As illustrated in FIGS. 15A and 15B and FIG. 16, the second inorganic sealing film 28 may be formed while covering the light emitting element layer 5, the terminal portion 44 that does not overlap with the second inorganic sealing film 28 and the terminal wire TW that extends toward the active region (display portion) DA from the terminal portion 44 may be formed on the TFT layer 4, and the carbide pattern CP may be formed in a gap between edges of the terminal portion 44 and the second inorganic sealing film 28, in a plan view. In this case, the carbide pattern CP intersects the terminal wire TW. In this way, the adhesiveness of a portion of the lower face film 10 that overlaps with the above-described gap and the carbide pattern CP is reduced, and this portion can be more easily removed. Thus, this is favorable for a configuration in which this portion of the lower face film 10 is (locally) removed, and the terminal portion 44 is bent so as to be oriented downward (a frame narrowing configuration).

Note that the edges of the carbide pattern CP need not necessarily be aligned with the cutting lines DL, and the carbide pattern CP may be formed so as to traverse a plurality of individual regions (regions surrounded by the cutting lines DL) aligned in the lateral direction (the direction in which the terminals are aligned), as illustrated in FIG. 15B.

An electro-optical element (an electro-optical element whose luminance and transmittance are controlled by an electric current) provided in the display device 2 according to the present embodiment is not particularly limited to a specific element. Examples of the display device 2 according to the present embodiment include an organic Electro Luminescence (EL) display provided with an Organic Light Emitting Diode (OLED) as the electro-optical element, an inorganic EL display provided with an inorganic light emitting diode as the electro-optical element, and a QLED display provided with a Quantum Dot Light Emitting Diode (QLED) as the electro-optical element.

Supplement

First aspect: A display device includes a lower face film, a TFT layer, and a light emitting element layer. A resin layer is provided above the lower face film and below the TFT layer, and a first region and a second region are included in a lower face of the resin layer. The second region is a carbide pattern in which an amount of carbide per unit area is greater than an amount of carbide per unit area in the first region.

Second aspect: In the display device according to the first aspect, for example, the lower face of the resin layer includes a first overlapping portion that overlaps with the light emitting element layer in a plan view, and the carbide pattern is formed in the first overlapping portion.

Third aspect: In the display device according to the second aspect, for example, the carbide pattern is a stripe array or a matrix-shaped pattern.

Fourth aspect: In the display device according to the first aspect, for example, the lower face of the resin layer includes a first overlapping portion that overlaps with the light emitting element layer in a plan view, and the carbide pattern is formed in the first overlapping portion.

Fifth aspect: In the display device according to the first aspect, for example, a terminal portion is provided on an end portion of the TFT layer, the lower face of the resin layer includes a second overlapping portion overlapping with the terminal portion in a plan view, and the carbide pattern is formed surrounding the second overlapping portion.

Sixth aspect: In the display device according to the first aspect, for example, the lower face of the resin layer includes a second overlapping portion overlapping with the terminal portion in a plan view, and the carbide pattern is formed in the second overlapping portion.

Seventh aspect: In the display device according to any one of the first to sixth aspects, for example, an inorganic sealing film is provided above the light emitting element layer, the TFT layer includes a terminal portion provided not overlapping with the inorganic sealing film and a terminal wire extending from the terminal portion toward an active region, and, in a plan view, the carbide pattern formed in a gap between the terminal portion and an edge of the inorganic sealing film intersects the terminal wire.

Eighth aspect: In the display device according to the seventh aspect, for example, a portion of the lower face film that overlaps with the gap and the carbide pattern is removed.

Ninth aspect: In the display device according to the eight aspect, for example, the terminal portion is bent and oriented downward.

Tenth aspect: In the display device according to any one of the first to ninth aspects, for example, the carbide pattern is a laser ablation trace of an organic material.

Eleventh aspect: In the display device according to any one of first to tenth aspects, for example, the resin layer includes a polyimide.

Twelfth aspect: In a display device production method in which, after a layered body including a resin layer, a TFT layer, and a light emitting element layer is formed on a substrate, a lower face of the resin layer is irradiated with laser from a reverse face of the substrate, and the substrate is peeled from the layered body, the display device production method includes irradiating a first region and a second region of the lower face of the resin layer with laser under irradiation conditions that are mutually different, and causing the second region to be a carbide pattern in which an amount of carbide per unit area is greater than an amount of carbide per unit area in the first region.

Thirteenth aspect: In the display device production method according to the twelfth aspect, for example, the irradiation conditions are the number of irradiations.

Fourteenth aspect: In the display device production method according to the twelfth aspect, for example, the irradiation conditions are an irradiation intensity.

Fifteenth aspect: In the display device production method according to the twelfth or thirteenth aspects, for example, an irradiation overlap ratio is set in accordance with the carbide pattern.

Sixteenth aspect: In the display device production method according to any one of the twelfth to fifteenth aspects, for example, after the lower face of the resin layer is scanned with laser in a first direction, the layered body is rotated, and the lower face of the resin film is scanned with laser in a second direction orthogonal to the first direction.

Seventeenth aspect: In the display device production method according to any one of the twelfth to sixteenth aspects, for example, after the substrate has been peeled off and a lower face film has been bonded to the lower face of the resin layer, the layered body is divided along a cutting line corresponding to each of individual pieces, and a plurality of the individual pieces are cut out.

Eighteenth aspect: In the display device production method according to the seventeenth aspect, for example, the second region is included in a gap between a cutting line corresponding to one of adjacent two of individual pieces and a cutting line corresponding to the other of the adjacent two of individual pieces.

Nineteenth aspect: A display device production device in which, after a layered body including a resin layer, a TFT layer, and a light emitting element layer is formed on a substrate, a lower face of the resin layer is irradiated with laser from a reverse face of the substrate, and the substrate is peeled from the layered body. A first region and a second region of a lower face of the resin layer are irradiated with laser under mutually different irradiation conditions, and the second region is caused to be a carbide pattern in which an amount of carbide per unit area is greater than an amount of carbide per unit area in the first region.

The disclosure is not limited to each of the above-described embodiments, and embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
4 TFT layer
5 Light emitting element layer
6 Sealing layer
10 Lower face film
12 Resin layer
21 Flattening film
24 EL layer
44 Terminal portion
50 Substrate
70 Display device production device
76 Film formation device
80 Peeling device
TM Terminal
NA Non-active region
DA Active region
CP Carbide pattern
DL Cutting line
Ra First region
Rb Second region

The invention claimed is:

1. A display device comprising:
a lower face film;
a TFT layer; and
a light emitting element layer,
wherein a resin layer is provided above the lower face film and below the TFT layer,
a first region and a second region are included in a lower face of the resin layer,
the second region is a carbide pattern in which an amount of carbide per unit area is greater than an amount of carbide per unit area in the first region,
an inorganic sealing film is provided above the light emitting element layer,
the TFT layer includes a terminal portion provided not overlapping with the inorganic sealing film and a terminal wire extending from the terminal portion toward an active region, and
in a plan view, the carbide pattern formed in a gap between the terminal portion and an edge of the inorganic sealing film intersects the terminal wire.

2. The display device according to claim 1,
wherein the lower face of the resin layer includes a first overlapping portion overlapping with the light emitting element layer in a plan view, and the carbide pattern is formed in the first overlapping portion.

3. The display device according to claim 2,
wherein the carbide pattern is a stripe array or a matrix-shaped pattern.

4. The display device according to claim 1,
wherein a terminal portion is provided on an end portion of the TFT layer, the lower face of the resin layer includes a second overlapping portion overlapping with the terminal portion in a plan view, and the carbide pattern is formed surrounding the second overlapping portion.

5. The display device according to claim 1,
wherein the lower face of the resin layer includes a second overlapping portion overlapping with the terminal portion in a plan view, and the carbide pattern is formed in the second overlapping portion.

6. The display device according to claim 1,
wherein a portion of the lower face film that overlaps with the gap and the carbide pattern is removed.

7. The display device according to claim 6,
wherein the terminal portion is bent and oriented downward.

8. The display device according to claim 1,
wherein the carbide pattern is a laser ablation trace of an organic material.

9. The display device according to claim 1,
wherein the resin layer includes a polyimide.

10. A display device production method in which, after a layered body including a resin layer, a TFT layer, and a light emitting element layer is formed on a substrate, a lower face of the resin layer is irradiated with laser from a reverse face of the substrate, and the substrate is peeled from the layered body, the display device production method comprising:
irradiating a first region and a second region of the lower face of the resin layer with laser under irradiation conditions that are mutually different, and causing the second region to be a carbide pattern in which an amount of carbide per unit area is greater than an amount of carbide per unit area in the first region.

11. The display device production method according to claim 10,
wherein the irradiation conditions are the number of irradiations.

12. The display device production method according to claim 10,
wherein the irradiation conditions are an irradiation intensity.

13. The display device production method according to claim 10,
wherein an irradiation overlap ratio is set in accordance with the carbide pattern.

14. The display device production method according to claim 10,
wherein, after the lower face of the resin layer is scanned with laser in a first direction, the layered body is rotated, and the lower face of the resin layer is scanned with laser in a second direction orthogonal to the first direction.

15. The display device production method according to claim 10,
wherein, after the substrate has been peeled off and a lower face film has been bonded to the lower face of the resin layer, the layered body is divided along a cutting line corresponding to each of individual pieces, and a plurality of the individual pieces are cut out.

16. The display device production method according to claim 15,
wherein the second region is included in a gap between a cutting line corresponding to one of adjacent two of individual pieces and a cutting line corresponding to the other of the adjacent two of individual pieces.

17. A display device comprising:
a lower face film;
a TFT layer; and
a light emitting element layer,
wherein a resin layer is provided above the lower face film and below the TFT layer,
a first region and a second region are included in a lower face of the resin layer,
the second region is a carbide pattern in which an amount of a carbide per unit area is greater than an amount of carbide per unit area in the first region,
the lower face of the resin layer includes a first overlapping portion overlapping with the light emitting element layer in a plan view, and
the carbide pattern is formed surrounding the first overlapping portion.

18. The display device according to claim 17, further comprising:
an inorganic sealing film provided above the light emitting element layer,
wherein the TFT layer includes a terminal portion provided not overlapping with the inorganic sealing film and a terminal wire extending from the terminal portion toward an active region, and
in a plan view, the carbide pattern formed in a gap between the terminal portion and an edge of the inorganic sealing film intersects the terminal wire.

19. The display device according to claim 18,
wherein a portion of the lower face film that overlaps with the gap and the carbide pattern is removed.

20. The display device according to claim 19,
wherein the terminal portion is bent and oriented downward.

* * * * *